(12) United States Patent
Tsuji

(10) Patent No.: US 10,746,568 B2
(45) Date of Patent: Aug. 18, 2020

(54) MATERIAL TESTER

(71) Applicant: Shimadzu Corporation, Kyoto (JP)

(72) Inventor: Hiroshi Tsuji, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 194 days.

(21) Appl. No.: 15/856,196

(22) Filed: Dec. 28, 2017

(65) Prior Publication Data

US 2018/0216962 A1    Aug. 2, 2018

(30) Foreign Application Priority Data

Jan. 31, 2017   (JP) .................................. 2017-015061

(51) Int. Cl.
  *G01D 5/00* (2006.01)
  *G01D 3/032* (2006.01)
  *H03H 17/02* (2006.01)

(52) U.S. Cl.
  CPC ............... *G01D 5/00* (2013.01); *G01D 3/032* (2013.01); *H03H 17/026* (2013.01); *H03H 2017/022* (2013.01)

(58) Field of Classification Search
  CPC ....................................................... G01D 5/00
  See application file for complete search history.

(56) References Cited

U.S. PATENT DOCUMENTS

| | | | | |
|---|---|---|---|---|
| 4,337,518 A * | 6/1982 | Ohnishi | ............. | H03H 17/0461 708/306 |
| 5,128,891 A | 7/1992 | Lynch et al. | | |
| 5,304,908 A * | 4/1994 | Oh | ....................... | G11B 15/473 318/608 |
| 5,764,557 A * | 6/1998 | Hara | ..................... | G06F 7/5443 708/603 |
| 2003/0063662 A1* | 4/2003 | Uchino | ................. | G06F 1/0335 375/226 |
| 2008/0120356 A1* | 5/2008 | Watanabe | .......... | H03H 17/0294 708/320 |
| 2008/0205563 A1* | 8/2008 | Simpson | ............ | H03H 17/0261 375/350 |
| 2011/0068961 A1* | 3/2011 | Hashimoto | ......... | H03M 1/0602 341/118 |

FOREIGN PATENT DOCUMENTS

| | | |
|---|---|---|
| JP | H04-227535 A | 8/1992 |
| JP | H06-230938 A | 8/1994 |
| JP | H10-145185 A | 5/1998 |
| JP | 2011044772 A * | 3/2011 |
| JP | 5724161 B2 | 5/2015 |

OTHER PUBLICATIONS

Search Report dated Jun. 7, 2018 in corresponding European Application No. 18151244.3; 9 pages.
Office Action dated Jun. 30, 2020 in corresponding Japanese Application No. 2017-015061; 6 pages including English-language translation.

* cited by examiner

*Primary Examiner* — Raymond L Nimox
(74) *Attorney, Agent, or Firm* — Maier & Maier, PLLC

(57) ABSTRACT

Data output from each of the "n" delay elements and a remainder value output from a divider in the previous calculation are input to an adder, and an addition process for obtaining a total sum thereof is executed. In addition, a division process is performed by dividing the total sum output from the adder by "n," and a quotient and a remainder are output from the divider. The remainder is delayed by a remainder delay element by one clock, is output to the adder, and is added in the next calculation.

3 Claims, 9 Drawing Sheets

FIG.7

| INPUT | OUTPUT | |
|---|---|---|
| DIVIDEND | QUOTIENT | REMAINDER |
| 10 | 1 | 2 |
| 9 | 1 | 1 |
| 8 | 1 | 0 |
| 7 | 1 | -1 |
| 6 | 1 | -2 |
| 5 | 1 | -3 |
| 4 | 0 | 4 |
| 3 | 0 | 3 |
| 2 | 0 | 2 |
| 1 | 0 | 1 |
| 0 | 0 | 0 |
| -1 | 0 | -1 |
| -2 | 0 | -2 |
| -3 | 0 | -3 |
| -4 | 0 | -4 |
| -5 | -1 | 3 |
| -6 | -1 | 2 |
| -7 | -1 | 1 |
| -8 | -1 | 0 |
| -9 | -1 | -1 |
| -10 | -1 | -2 |

FIG.9

| | INPUT VALUE (1) | AVERAGE VALUE (1/8) | | INTEGRATED VALUE OBTAINED THROUGH EIGHT CALCULATIONS (2) | ERROR (2)-(1) |
|---|---|---|---|---|---|
| | | CALCULATED VALUE | AFTER ROUNDING | | |
| 1 | 80 | 10.00 | 10 | 80 | 0 |
| 2 | 90 | 11.25 | 11 | 88 | -2 |
| 3 | 100 | 12.50 | 13 | 104 | 4 |
| 4 | 110 | 13.75 | 14 | 112 | 2 |
| 5 | 120 | 15.00 | 15 | 120 | 0 |

FIG.10

| NUMBER OF n | BIT LENGTH OF RELATED ART | NECESSARY BIT LENGTH |
|---|---|---|
| 8 | INPUT BIT NUMBER + 3 | INPUT BIT NUMBER + 3 × 4 |
| 16 | INPUT BIT NUMBER + 4 | INPUT BIT NUMBER + 4 × 4 |
| 32 | INPUT BIT NUMBER + 5 | INPUT BIT NUMBER + 5 × 4 |
| 64 | INPUT BIT NUMBER + 6 | INPUT BIT NUMBER + 6 × 4 |
| 128 | INPUT BIT NUMBER + 7 | INPUT BIT NUMBER + 7 × 4 |
| 256 | INPUT BIT NUMBER + 8 | INPUT BIT NUMBER + 8 × 4 |
| 512 | INPUT BIT NUMBER + 9 | INPUT BIT NUMBER + 9 × 4 |
| 1024 | INPUT BIT NUMBER + 10 | INPUT BIT NUMBER + 10 × 4 |

MATERIAL TESTER

BACKGROUND OF THE INVENTION

Field

The present invention relates to a material tester having a digital filter configured to remove noise of data input from a sensor.

Background

A material tester for evaluating a material property has a sensor for measuring a physical amount. In order to process a measurement signal obtained from the sensor, a digital filter in which a window function such as the Blackman-Harris window is set as a coefficient of the filter has been proposed. Note that, in the digital filter using the window function, a convolution for computing a filter output is performed by calculating a total sum of delay data while multiplying the delay data stored in a delay element by the filter coefficient (see JP-A-10-145185).

Meanwhile, in order to employ a digital filter using a window function in the material tester, it is necessary to provide a memory for storing the filter coefficient and a multiplier for multiplying the delay data stored in the delay element by the filter coefficient in a filter circuit. If the multiplier and the filter coefficient memory are provided in the filter circuit, the circuit size increases. For this reason, a digital filter capable of simplifying a circuit configuration by repeating a moving average calculation across four stages instead of using the window function has been proposed (see Japanese Patent No. 5,724,161).

SUMMARY

FIG. 8 is a block diagram illustrating a digital signal processing path until an input from a sensor is displayed on a display unit. In some cases, a displacement gauge as a sensor for measuring a physical amount is provided with a rotary encoder or a linear encoder having an incremental output. FIG. 8 illustrates a digital signal processing path until an output from a linear encoder is displayed on the display unit.

As illustrated in FIG. 8, a digital circuit that processes a pulse signal input from the linear encoder having an incremental output has a counter arranged between the linear encoder and a digital filter to integrate a pulse output of the linear encoder on a regular basis, and a differential signal is input to the digital filter through this counter. Note that the counter transmits a count value to a rear stage on a regular basis and is reset to zero. The differential signal averaged by the digital filter is input to an integrator, and the obtained integrated value is displayed on the display unit as an extension of a test sample. In the digital circuit that finally integrates differential data from the sensor, a correct answer is not obtained if there is a canceled digit or a rounding error in the calculation process. When differential data from the linear encoder is input to the digital filter, and an output from the digital filter is integrated with the integrator, a canceled digit or a rounding error generated in the calculation process is also integrated by the integrator, so that the error increases disadvantageously. In order to avoid this problem, in some material testers, the integrated data is input to the digital filter, and an output of the digital filter is transmitted to the display unit. However, in some material testers, the integrator is embedded as a circuit block relating to a display functionality of the display unit into a circuit board where the circuit of the display unit is placed. In this case, as illustrated in FIG. 8, a digital filter for removing noise is inevitably inserted between the linear encoder and the integrator.

FIG. 9 is a table for describing a calculation error generated by a digital filter that performs a moving average calculation in the related art. FIG. 10 is a table for describing a bit length necessary to implement a calculation without integrating an error in a digital filter that calculates a moving average in the related art.

As the digital filter that performs a moving average calculation of the related art, a digital filter of FIG. 1 discussed in Patent Literature 2 may be conceived. In the table of FIG. 9, a filter circuit of FIG. 1 discussed in Patent Literature 2 is configured as an integer calculation circuit, and an integrated value of an output result of an impulse response is compared by changing an input value. In the column of the right end of the table, for Examples 1 to 5 having different impulse input values (1) and integrated values (2) obtained by performing calculation eight times in a filter circuit of one stage of eight delay elements (n=8) for sequentially shifting the input data, errors (2)–(1) between the integrated value (2) and the impulse input value (1) are estimated. Note that the digital filter of FIG. 1 discussed in Patent Literature 2 does not include a multiplier, and the number of taps of the filter corresponds to the number "n" of the delay elements. In addition, it is assumed that the impulse input value is input to the first delay element as the first data, and zero is stored in other seven delay elements.

As indicated in the column of average values in the table, in all examples, a difference between a calculated value obtained by dividing the input value by "n" and a value obtained by rounding this calculated value to an integer becomes one digit or smaller in every calculation process. When the input value is an integer multiple of "n" (multiple of "8") as in Example 1 or 5, the calculated value obtained by dividing the input value by "n" is equal to the value obtained by rounding, and no rounding error is generated. Therefore, an error is not generated in the integrated value subjected to the filter circuit and the input integrated value. Meanwhile, when the input value is not the integer multiple of "n" as in Examples 2 to 4, that is, when the input value is not divided by "8" without a remainder, a difference between the integrated value obtained by eight calculations after the filter circuit and the integrated value of the input value before the filter circuit becomes one digit or greater. That is, the error generated through the rounding calculation is integrated, so that the input integrated value and the output integrated value of the digital filter do not match each other. In this case, a value obtained by simply integrating the input value of the digital filter and an output value of the integrator obtained by integrating the values subjected to the filtering do not match each other, and an error is generated in the data displayed on the display unit.

In order to prevent an error generated by the rounding calculation, the calculation may be performed with higher accuracy by increasing a resolution (bit number) of the calculation. In the table of FIG. 10, using a digital filter that repeats the moving average calculation of FIG. 1 discussed in Patent Literature 2 across four stages, a bit length used in the calculation of the related art and a bit length necessary to prevent an error are compared for each number of delay elements (number of "n") per one stage of the filter circuit. For example, in the related art, in order to provide a digital filter (n=1,024) for handling input data having a length of 32 bits, a circuit configuration capable of handling data of a length of 42 bits (input bit number 32+10=42) is provided as illustrated in the lowermost row of the table of FIG. 10. In addition, in order to prevent an error in the rounding calculation, it is necessary to provide a circuit configuration capable of handling data having a length of 72 bits (input bit number 32+10×4=72). This is not realistic.

The digital filter discussed in Patent Literature 2 is reasonable to obtain a result close to a calculation result of the Blackman-Harris window with a simple configuration. However, the error generated by the rounding calculation is integrated as described, so that a problem is generated in accuracy of display when the data is displayed on the display unit. In addition, even when the calculation accuracy is improved so as not to generate an error of the rounding calculation by increasing the bit number of the filter, a large-sized circuit is necessary.

In view of the aforementioned problems, an object of the invention is to provide a material tester having a digital filter capable of high-accuracy filtering without integrating an error caused by a rounding calculation using a simple configuration even when an integrated value obtained by inputting a differential signal obtained on a regular basis to the digital filter and inputting its output to an integrator is displayed on a display unit.

Solution to Problem

According to the invention, there is provided a material tester including: a noise removal filter to which data on a variation of a physical amount output from a sensor is input; an integrator configured to integrate data subjected to filtering of the filter; and a display unit configured to display the data, in which a filter circuit of the filter has "n" data delay elements cascaded to sequentially accumulate input data from the sensor, an adder configured to obtain a total sum of the data output from each of the "n" delay elements, a divider configured to output a quotient obtained by dividing the output of the adder by the number "n" of the delay elements as averaged data and output a remainder to a remainder delay element, and a circuit configured to add an output of the remainder delay element to the adder.

According to the invention, it is preferable that the remainder output from the divider has an absolute value equal to or smaller than "½" of a divisor "n."

According to the invention, it is preferable that the filter is configured by cascading filter circuits having a similar configuration across four stages.

According to the invention, it is preferable that the sensor is a displacement gauge having a rotary encoder or a linear encoder.

Advantageous Effects of the Invention

According to the invention, the remainder output from the divider of the filter circuit is returned to the adder via the remainder delay element. Therefore, unlike the related art, a rounding error generated in every calculation is not rounded off. For this reason, in terms of time as a whole, no error is generated between a value obtained by directly integrating the input value of the digital filter and an integrated value of the integrator obtained by integrating the averaged value after the filtering. Therefore, it is possible to improve accuracy of display of the display unit, compared to the related art. In addition, since there is no need to increase the bit number of the filter in order to prevent integration of the error, it is not necessary to increase the size of the circuit in order to embed the digital filter.

According to the invention, since the remainder output from the divider has an absolute value equal to or smaller than "½" of "n," a negative value is also allowable. When only a positive remainder is returned to the adder, an offset is generated, so that the output may be boosted as a whole. According to the invention, since a negative remainder is allowed as a value applied to the adder that outputs a total sum, it is possible to suppress such a phenomenon. Therefore, it is possible to improve accuracy of the number displayed on the display unit.

According to the invention, the filter is configured by cascading filter circuits having a similar configuration across four stages to repeat the moving average calculation across four stages. Therefore, it is possible to obtain a calculation result close to that of the Blackman-Harris window.

According to the invention, since an output of the displacement gauge is processed using a digital filter, it is possible to improve measurement accuracy of the displacement.

BRIEF DESCRIPTION OF THE DRAWINGS

FIG. 7 is a table illustrating input and output values of a divider in the case of "n=8."

FIG. 9 is a table for describing a calculation error in a digital filter that performs a moving average calculation in the related art; and FIG. 10 is a table for describing a bit length necessary to implement a calculation so as not to generate an error in the digital filter that performs a moving average calculation of the related art.

DETAILED DESCRIPTION

Figure 1:
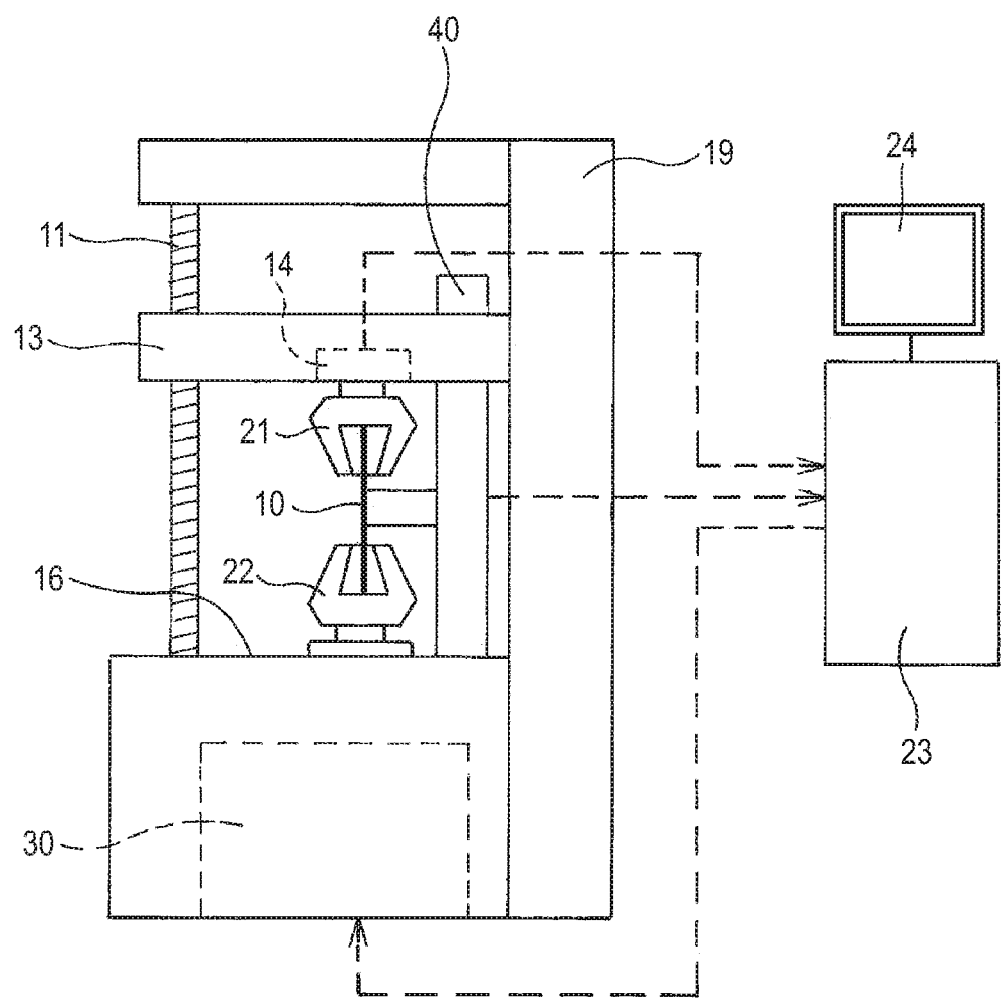
FIG. 1 is a schematic diagram illustrating a material tester according to the invention.

Embodiments of the invention will now be described with reference to the accompanying drawings. FIG. 1 is a schematic diagram illustrating a material tester according to the invention.

The material tester includes a table 16, a pair of threaded rods 11 vertically and rotatably erected on the table 16, a crosshead 13 movable along the threaded rods 11, and a loading mechanism 30 for applying a test force to a test sample 10 by moving the crosshead 13. The pair of threaded rods 11 are covered by a pair of covers 19. However, FIG. 1 illustrates a state in which the left cover 19 located in the left side on the paper plane out of the pair of covers 19 is removed.

The crosshead 13 is connected to the pair of threaded rods 11 such as a ball screw with a nut (not shown). A lower end of each threaded rod 11 is connected to the loading mechanism 30, so that power from a motor as a power source of the loading mechanism 30 is transmitted to the pair of threaded rods 11. As a pair of threaded rods 11 are rotated in synchronization, the crosshead 13 is lifted or lowered along a pair of threaded rods 11.

The crosshead 13 is provided with an upper clamp 21 for clamping an upper end of the test sample 10. Meanwhile, the table 16 is provided with a lower clamp 22 for clamping a lower end of the test sample 10. In the case of a tension test, a test force (tensile load) is applied to the test sample 10 by lifting the crosshead 13 while both ends of the test sample 10 are clamped by the upper and lower clamps 21 and 22. In this case, the test force applied to the test sample 10 is detected by a load cell 14 and is input to a controller 23. In addition, extension of the test sample 10 is measured by a displacement gauge 40 provided in the table 16.

The controller 23 includes a computer or a sequencer provided with a central processing unit (CPU) or the like. As illustrated in FIG. 1, the controller 23 is connected to the load cell 14, the loading mechanism 30, and the displacement gauge 40. In addition, the controller 23 collects test force data from the load cell 14 or displacement data from the displacement gauge 40 and executes a data processing. Through the processing such as computation in the controller 23, a relationship between the test force to the test sample 10 and the displacement is obtained. Furthermore, the controller 23 is connected to a display unit 24 to display the test force or the displacement. The displacement is converted and displayed as an extension length of the test sample in some cases.

Figure 2:
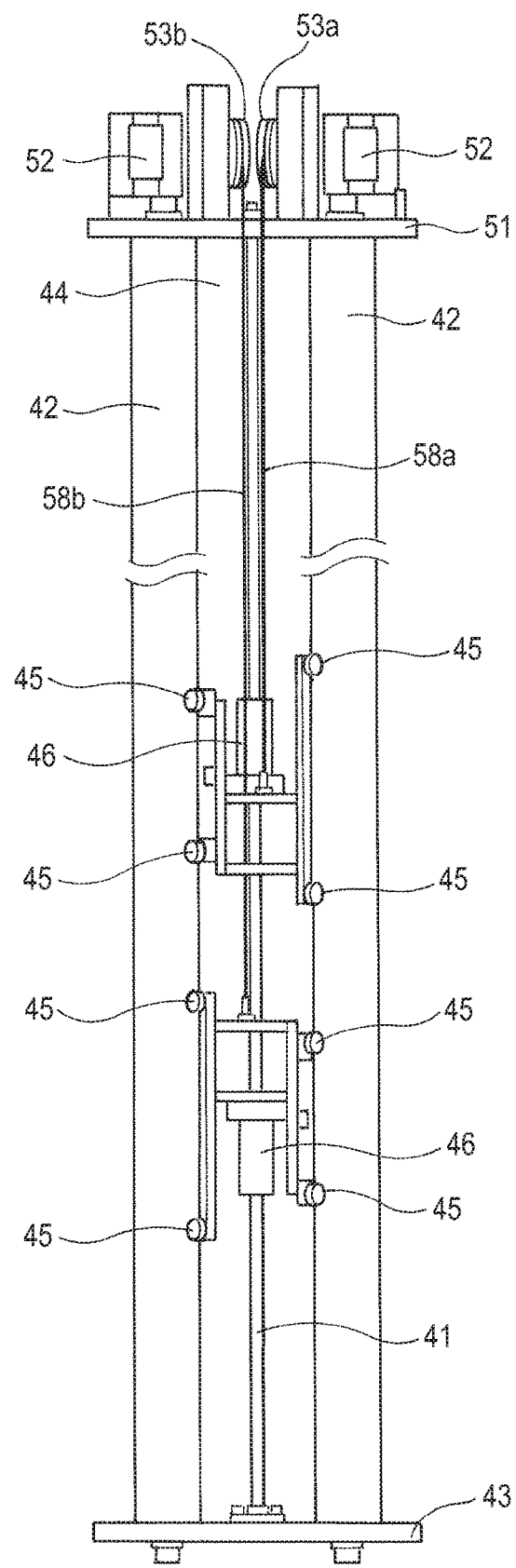
FIG. 2 is a front view illustrating a displacement gauge.
Figure 3:
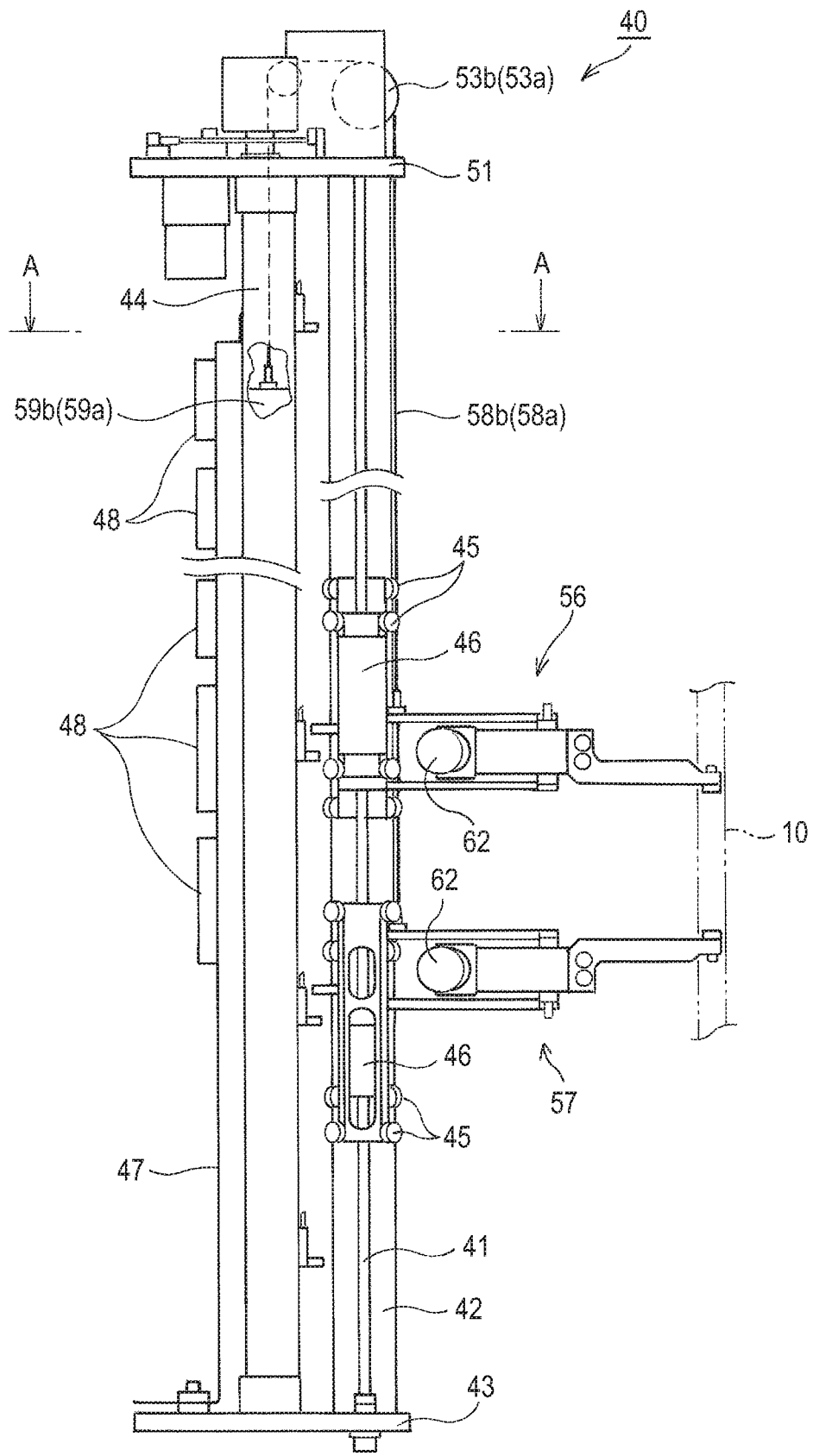
FIG. 3 is a lateral vertical cross-sectional view illustrating the displacement gauge.
Figure 4:
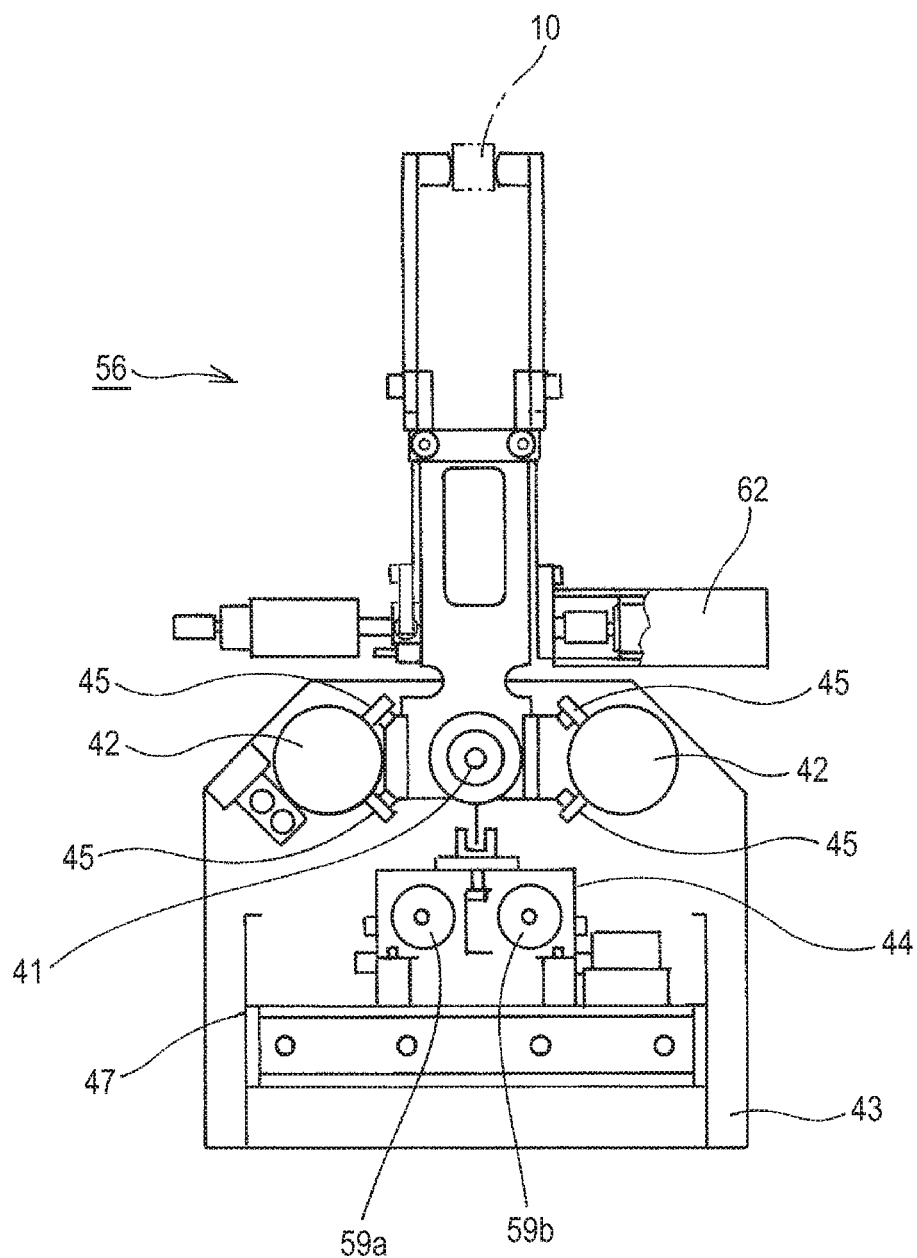
FIG. 4 is a cross-sectional view taken along a line A-A of the displacement gauge of FIG. 3.

FIG. 2 is a front view illustrating the displacement gauge 40. FIG. 3 is a lateral vertical cross-sectional view illustrating the displacement gauge 40. FIG. 4 is a cross-sectional view taken along the line A-A of the displacement gauge 40 of FIG. 3. Note that, in FIG. 2, upper and lower arms 56 and 57 are not illustrated for simplicity purposes.

The displacement gauge 40 is a linear encoder type displacement gauge having an incremental output. The displacement gauge 40 as a sensor for measuring a displacement has the upper and lower arms 56 and 57 moving as the test sample 10 extends. The upper and lower arms 56 and 57 are held by a guide rail 42 erected on a base 43 to be lifted or lowered. The upper and lower arms 56 and 57 are straightly guided by actuating a roller 45 rolling on the surface of the guide rail 42. In addition, a post 44 is erected on the base 43. Furthermore, a support plate 47 that supports a plurality of circuit boards 48 is connected to the base 43 and the post 44.

The locations of the upper and lower arms 56 and 57 are detected by a linear scale 41. A scale coil serving as a scale is arranged inside the linear scale 41 at a constant pitch. In addition, a sensor unit 46 is provided in each of the upper and lower arms 56 and 57. A variation of the distance between the upper and lower arms 56 and 57 is obtained on the basis of a distance from a reference position before and after movement of the upper and lower arms 56 and 57 detected by the sensor unit 46. The movement distance of the upper or lower arms 56 or 57 is a displacement, and a variation of the distance between both arms is an extension length of the test sample 10. The displacement gauge 40 outputs a signal corresponding to its variation to the controller 23 depending on the displacements of the upper and lower arms 56 and 57.

A support 51 is connected to the upper ends of the linear scale 41 and the post 44, and the support 51 is provided with pulleys 53a and 53b and a pair of stepping motors 52 connected to the pulleys 53a and 53b. A wire 58a is wound around the pulley 53a, and a wire 58b is wound around the pulley 53b. The upper arm 56 is connected to one end of the wire 58a, and a balance weight 59a is suspended from the other end of the wire 58a. Similarly, the lower arm 57 is connected to one end of the wire 58b, and a balance weight 59b is suspended from the other end of the wire 58b. The balance weights 59a and 59b are lifted or lowered inside the post 44. The balance weights 59a and 59b allow the upper and lower arms 56 and 57 to stop at any position when an external load is zero.

Each stepping motor 52 is connected to each of the pulleys 53a and 53b by interposing a clutch. When a test is prepared, the upper and lower arms 56 and 57 are spaced from each other by a predetermined length in order to make contact with the test sample 10 having both ends clamped by the upper and lower clamps 21 and 22. In order to move the upper and lower arms 56 and 57 to a test start position, the clutch is set to ON to rotate the pulleys 53a and 53b by driving the stepping motors 52. Then, the wires 58a and 58b move, so that each of the upper and lower arms 56 and 57 is lifted or lowered along each guide rail 42. Note that the upper and lower arms 56 and 57 are a pair of members whose arm tips approach each other and recede from each other in the left-right direction on the paper plane of FIG. 4. Each of the upper and lower arms 56 and 57 has a stepping motor 62, and is detachably attached to the test sample 10 by opening or closing each arm tip by driving the stepping motor 62.

Figure 5:
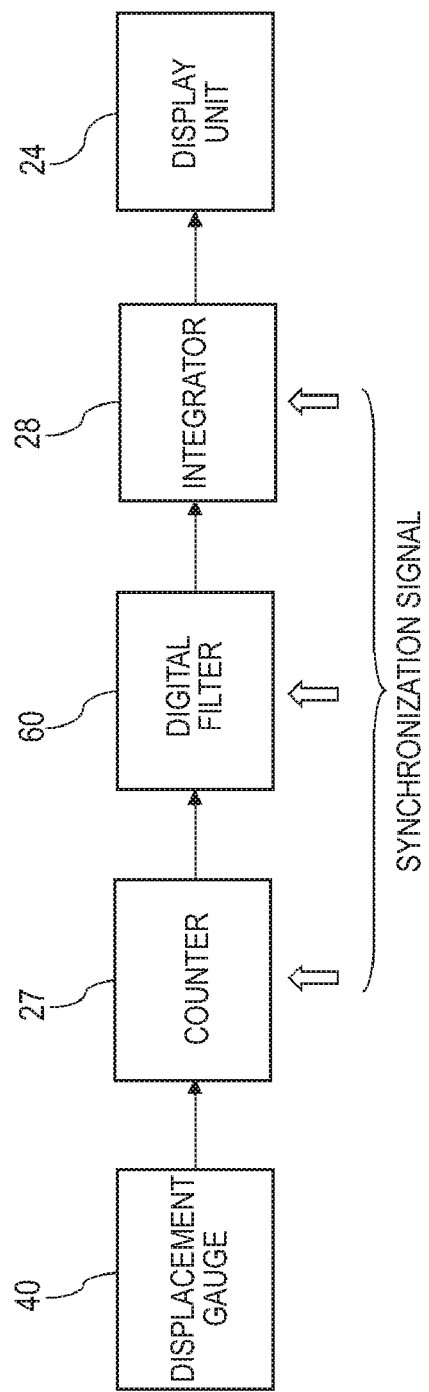
FIG. 5 is a block diagram illustrating a digital signal processing path until an output of the displacement gauge is displayed on a display unit.

FIG. 5 is a block diagram illustrating a digital signal processing path until an output of the displacement gauge 40 is displayed on the display unit 24.

The displacement detected by the displacement gauge 40 is displayed on the display unit 24 via a counter 27, a digital filter 60, and an integrator 28. Note that each block of the counter 27, the digital filter 60, and the integrator 28 is arranged inside the controller 23. In addition, each block receives a synchronization signal transmitted at a constant interval in order to advance the processing at the same time in synchronization with input/output timings of the data between the blocks.

As the upper arm 56 or the lower arm 57 moves, a pulse signal output from the displacement gauge 40 is input to the counter 27 and is counted. A value integrated by the counter 27 is transmitted to the digital filter 60 in synchronization with the timing of the synchronization signal and is reset to zero in every calculation. The synchronization signal is a signal applied on a regular basis such as 1 millisecond. A value of the counter 27 transmitted to the next stage corresponds to a displacement obtained at a time interval of the synchronization signal (a variation of the displacement, that is, differential data). A variation thereof is subjected to a predetermined filtering calculation with the digital filter 60 as described below, and a calculation result is transmitted to the integrator 28. The integrator 28 adds the calculation result transmitted from the digital filter 60 to a current integrated value to obtain a new integrated value. Then, the new integrated value is transmitted to the display unit 24, and a value of the displacement displayed on the display unit 24 is updated to the new integrated value. This integrated value corresponds to a value (displacement) indicating a current position of the arm of the displacement gauge 40.

Figure 6:
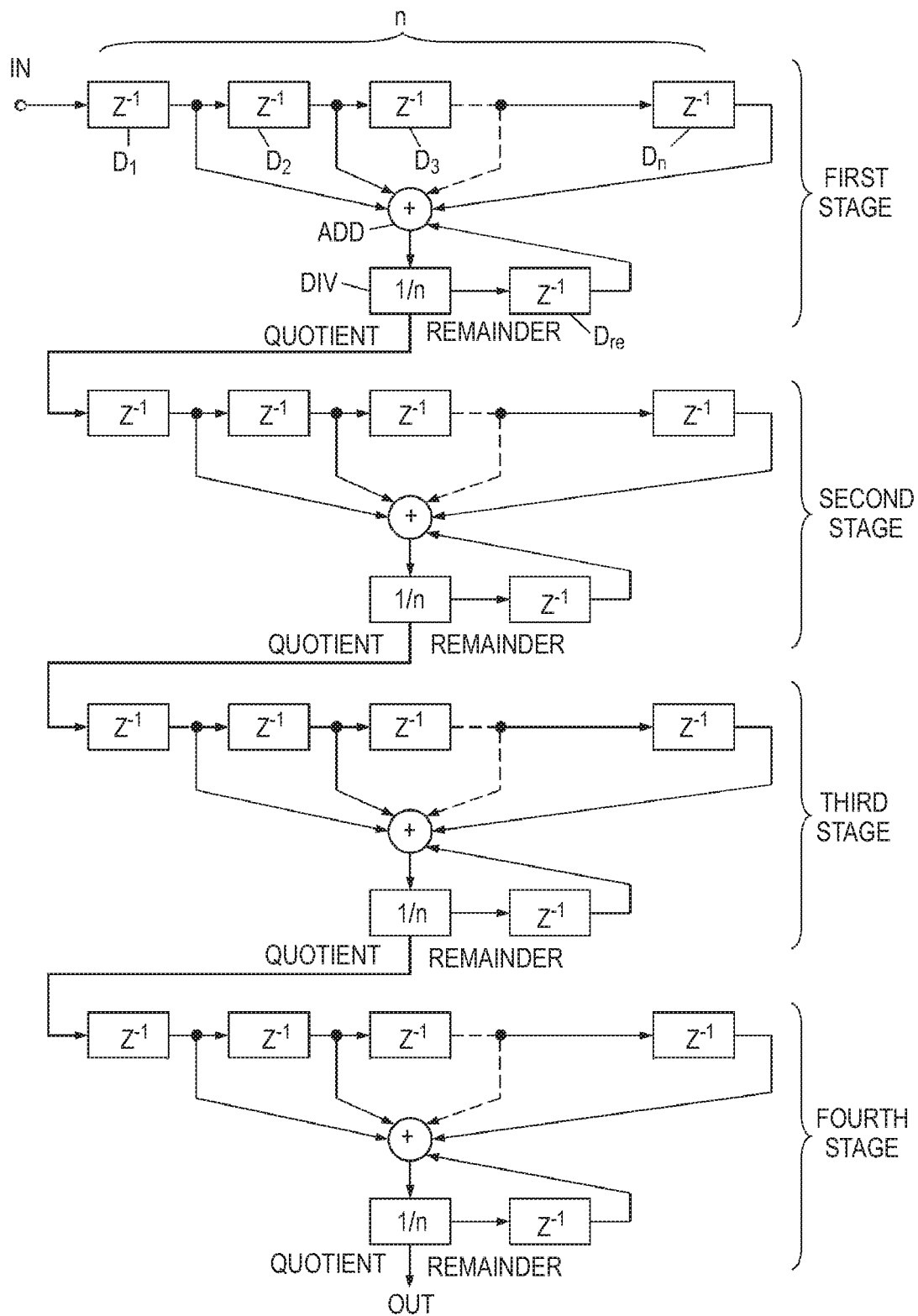
FIG. 6 is a block diagram illustrating a configuration of a digital filter.
Figure 8:
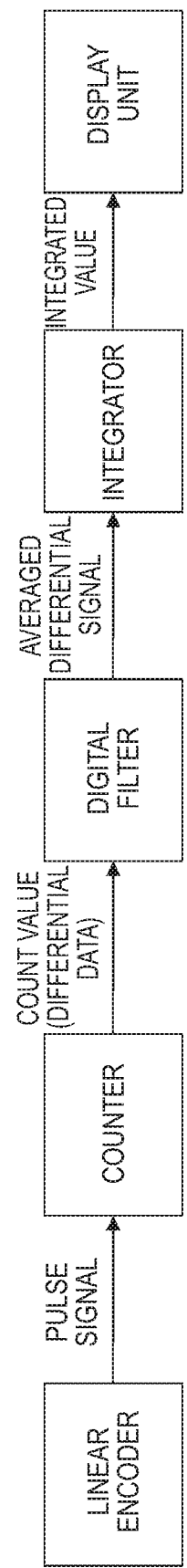
FIG. 8 is a block diagram illustrating a digital signal processing path until an input from a sensor is displayed on the display unit.

FIG. 6 is a block diagram illustrating a configuration of the digital filter 60.

The digital filter 60 as a noise removal filter has a cascaded connection of four filter circuits. The filter circuit includes "n" data delay elements $D_1$ to $D_n$ cascaded to sequentially accumulate the input data, an adder ADD that adds the data output from each delay element $D_1$ to $D_n$, a divider DIV that divides a result of the addition output from the adder ADD, and a remainder delay element $D_{re}$ for delaying a timing for receiving a value of the remainder out of the division result output from the divider DIV and returning it to the adder ADD. A single filter circuit serves as a digital filter by itself. However, according to this embodiment, it is assumed that the same filter circuit is repeated across multiple stages (four stages) in a single digital filter 60.

The digital data to be filtered is converted into data counted by the counter 27 on a regular basis and is sequentially input to an input terminal IN at the timing of the synchronization signal. In a single calculation, the input data is shifted to the right one by one across the "n" delay elements $D_1$ to $D_n$. In every calculation, an addition process for obtaining a total sum of the data output from each of the "n" delay elements $D_1$ to $D_n$, and a division process for dividing the total sum output from the adder ADD by "n" are executed, and a calculation result is output from the divider DIV.

A remainder obtained by dividing the total sum by "n" out of the output of the divider DIV is input to the adder ADD via the delay element $D_{re}$ and is added. Since the delay element $D_{re}$ delays the input of the remainder to the adder ADD by one clock, the remainder subjected to the division process is incorporated into the next calculation at all times. That is, in the calculations subsequent to the first calculation, the remainder output from the divider DIV in the previous calculation is incorporated into the total sum output from the adder ADD. A quotient of the output of the divider DIV is input to the second stage filter circuit as averaged data of the first stage filter circuit.

The second stage filter circuit has the same configuration as that of the first stage filter circuit. The averaged data output from the second stage filter circuit is input to the third stage filter circuit. The third stage filter circuit has the same configuration as that of the first stage filter circuit. The averaged data output from the third stage filter circuit is input to the fourth stage filter circuit. In addition, the fourth stage filter circuit has the same configuration as that of the first stage filter circuit. The averaged data output from the fourth stage filter circuit becomes a final output OUT of the digital filter 60. In this manner, in the digital filter 60 having the number of taps multiplied by four stages (n×4), the filtering calculation is executed by setting the moving averaged data of each filter circuit as the input data of the next stage filter circuit.

Next, the remainder output from the divider DIV will be further described. FIG. 7 is a table illustrating the input/output of the divider DIV in the case of "n=8."

The divider DIV of the filter circuit of each stage in the digital filter 60 divides the total sum input from the adder ADD and outputs a quotient and a remainder as a calculation result. Here, the remainder output from the divider DIV is set to a value having an absolute value equal to or smaller than "½" of the divisor "n." That is, a negative value is allowed as the remainder value output from the divider DIV. In the table of FIG. 7, the output values of the divider DIV (quotient and remainder) are obtained by assuming that the input dividend has a value between "10" and "−10" when "n=8 (number of taps)" in the first stage filter circuit. As indicated in this table, the remainder obtained by dividing each dividend by "8" becomes a value between "4" and "−4." In this manner, an absolute value of the remainder becomes "8/2=4" or smaller. In this filter circuit, a negative value is allowed as the remainder value output from the divider DIV. Therefore, it is possible to suppress the output from being boosted as a whole.

Since the remainder output from the divider DIV of the filter circuit is returned to the adder ADD via the delay element $D_{re}$, a rounding error generated in each calculation is not rounded off, but is incorporated into a total sum output from the adder ADD in the next calculation unlike the related art. For this reason, in terms of time as a whole, a value obtained by directly integrating the input value of the digital filter 60 matches the integrated value of the integrator 28 obtained by integrating the averaged value subjected to filtering. That is, display accuracy of the display unit 24 is improved, compared to the related art.

In this filter circuit, since the remainder is incorporated into the total sum of the next calculation, it is possible to perform the calculation with higher accuracy by improving performance of the digital filter using the same bit number as that of the related art. For this reason, it is possible to suppress an increase of the size of the filter circuit.

Note that, although a case where the signal processed by the digital filter 60 is a signal from the linear encoder type displacement gauge 40 has been described by way of example in this embodiment, a signal source of the signal input to the digital filter 60 is not limited to a detection signal of the linear encoder. That is, any signal source, such as a sensor having a rotary encoder, capable of outputting a variation (difference) of the physical amount such as a movement distance or a displacement during a material test may also be employed.

According to this embodiment, the digital filter 60 is configured to repeat the moving average calculation across four stages, it is possible to obtain a calculation result close to that of the Blackman-Harris window. Using this digital filter 60, it is possible to provide a filter similar to the digital filter based on a window function with a simple configuration.

Note that, although the moving average calculation is repeated across four stages in this embodiment, the invention is not limited to the number of stages. The invention is applicable to all cases of multiples stages including one stage which is a simple moving average calculation.

What is claimed is:

1. A material tester comprising:
   a noise removal filter to which data on a variation of a physical amount output from a sensor is input;
   an integrator configured to integrate data subjected to filtering of the filter; and
   a display unit configured to display the data,
   wherein a filter circuit of the filter has:
   "n" data delay elements cascaded to sequentially accumulate input data from the sensor,
   an adder configured to obtain a total sum of data output from each of the "n" delay elements,
   a divider configured to output a quotient value obtained by dividing an output of the adder by the number "n" of the delay elements as averaged data and output a remainder value, both of the quotient value and the remainder value being positive or negative values, and the divider being configured to output a remainder to a remainder delay element, the remainder being an absolute value of the remainder value and equal to or less than "½" of a divisor "n", and
   a circuit configured to add an output of the remainder delay element to the adder.

2. The material tester according to claim 1, wherein the filter is configured by cascading filter circuits having a similar configuration across four stages.

3. The material tester according to claim 1, wherein the sensor is a displacement gauge having a rotary encoder or a linear encoder.

\* \* \* \* \*